United States Patent [19]
Szot et al.

[11] Patent Number: 6,040,070
[45] Date of Patent: Mar. 21, 2000

[54] PEROVSKITE TYPE $ABO_3$ WITH SURFACE LAYER

[75] Inventors: Krzysztof Szot, Kattowicz, Poland; Wolfgang Speier; Jörg Herion, both of Jülich, Germany

[73] Assignee: Forschungszentrum Jülich GmbH, Jülich, Germany

[21] Appl. No.: 09/109,734

[22] Filed: Jul. 2, 1998

Related U.S. Application Data

[63] Continuation-in-part of application No. PCT/DE96/02501, Dec. 21, 1996.

[30]     Foreign Application Priority Data

Jan. 5, 1996 [DE] Germany .................... 196 00 218

[51] Int. Cl.⁷ ........................... B32B 9/00; C23C 8/10
[52] U.S. Cl. ..................... 428/700; 148/284; 423/635; 423/636; 428/697; 428/701; 117/947; 429/45
[58] Field of Search ............... 75/235; 117/947; 148/284; 423/635, 636; 428/548, 697, 700, 701; 429/45

[56]     References Cited

U.S. PATENT DOCUMENTS 5,656,382   8/1997   Nashimoto .............................. 428/620

OTHER PUBLICATIONS

Szot, K. et al., "Layer structures BaO–BaTiO3 in the region of p–type conductivity on the surface of BaTiO3", Applied Physics A, vol. 53:563–567, Dec. 1991.

Liang, Yong et al., "Atomic structures of reduced SrTiO3 (001) surfaces", Surface Science Letters, vol. 285:L510–L516, Apr. 1993.

*Primary Examiner*—Benjamin L. Utech
*Assistant Examiner*—Donald L. Champagne
*Attorney, Agent, or Firm*—Klaus J. Bach

[57]     ABSTRACT

On the (100) surface of a perovskite of the type $ABO_3$, a Ruddlerden-Popper $AO^*(ABO_3)_n$ layer is generated by exposing the perovskite to an oxidizing atmosphere at temperatures above 750° C.

3 Claims, No Drawings

PEROVSKITE TYPE $ABO_3$ WITH SURFACE LAYER

This is a Continuation-in-Part application of international application PCT/DE96/02501 filed Dec. 21, 1996 and claiming the priority of German patent application 196 00 218.4 filed Jan. 5, 1996.

BACKGROUND OF THE INVENTION

The invention relates to a perovskite of the $ABO_3$ type provided with a surface layer. The perovskites are for example, $SrTiO_3$, $BaTiO_3$ or $KNbO_3$. The invention also relates to a method of manufacturing such perovskites.

It is known to utilize perovskites as substrates for single crystal layer growth or as a material for high temperature fuel cells.

Perovskites have at their surfaces depressions or projections of a size corresponding about to their lattice parameter C=4 Å. These deviations from a smooth surface detrimentally affect single crystal layer growth on the perovskites.

In addition, the life of a perovskite used in a high temperature fuel cell is limited because of the chemically aggressive environment.

It is the object of the present invention to provide a perovskite which is chemically more stable and is more suitable as a substrate for single crystal layer growth and to provide a method of manufacturing such perovskites.

SUMMARY OF THE INVENTION

In accordance with the invention, a perovskite of the type $ABO_3$ is provided with a surface layer of $AO*(ABO_3)_n$ produced at high temperatures in an oxidizing atmosphere. $AO*(ABO_3)_n$ is known as Ruddlesden-Popper phase. The layer is built up in the form of terraces, that is, it has at its surface delimited areas which are separated from each other by steps. The height of the steps corresponds to the lattice parameters of the Ruddlesden-Popper phase with a predetermined n in c—direction of the standard cell c*=(2n+1)c represents the lattice parameter of the Ruddlesden-Popper phase. C is the lattice parameter of the original Perovskite. The surface areas are free of projections or depressions of a size in the area of 4 Å which occurs with the perovskites as mentioned earlier. From the layer as claimed, strip-like or island-like areas of an $AO*(ABO_3)_n$ phase are to be distinguished as will be described below.

The terrace-like arrangement of the $AO*(ABO_3)_n$ layer is chemically more stable than a simple perovskite of the type $ABO_3$. Consequently, this new material is suitable, in an improved way, for use in a chemically oxidizing atmosphere that is for example in an atmosphere which causes strong segregations of components of perovskite. Such an atmosphere is present especially in high temperature fuel cells particularly at the cathode side. To prevent aging processes from occurring, perovskites with $AO*(ABO_3)_n$ surface layers are preferably used in high temperature fuel cells, for example, in the form of electrodes.

If a perovskite is provided with a $AO*(ABO_3)_n$ surface layer, n–1 terrace-like structures are formed on the surface. It is then possible in a way which is better than it has been possible in the past, to grow on such a layer for example, a single crystal $YBa_2Cu_3O_7$. The improvement is possible because the lattice constant of $YBa_2Cu_3O_7$ is about 11.6–11.7 Å and is therefore comparable to the step height of the terrace structures.

The occurrence of new phases such as $Sr_{n+1}Ti_nO_{3n+1}$ at the perovskite $SrTiO_3$ is known, for example, from Surface Science Letters 285 (1993) L510–L516. This phase was obtained under reducing conditions; it grows normal to the surface. It occurs in stripes. It is therefore not a layer. In addition, there is no Ruddlesden-Popper phase.

The occurrence and the manufacture of Ruddlesden-Popper phases as terrace-like layers which extend over the whole surface of a perovskite and have controllable step heights (2n+1)c is not known.

It is also not known to use $AO*(ABO_3)_n$ phases as protective layers or as means for the improvement of single crystal growth.

Layer structures consisting of a perovskite of the type $ABO_3$ with a $AO*(ABO_3)_n$ surface layer as a substrate and with a single crystal layer on the $AO*(ABO_3)_n$ layer have a higher quality as well as a smaller number of staple defects by adaptation of the c-lattice constant (=lattice parameter of the Ruddlesden-Popper phase) to the lattice constant of the single crystal layer. The better the respective lattice constants are adapted, the higher is the layer quality.

DESCRIPTION OF PREFERRED EMBODIMENTS

The $AO*(ABO_3)_n$ layers for the perovskites $SrTiO_3$, $BaTiO_3$, $PbTiO_3$ or $KnbO_3$ were made by exposing these perovskites to an oxidizing environment (particularly, an $O_2$ environment at pressures of 1–200 mbar) and a temperature of 800 to 950° C. Under these conditions, the $AO*(ABO_3)_n$ phase is formed in a growth pattern parallel to the (100) surface. Dependent on the selected temperature and the selected oxygen pressure, uniform $AO*(ABO_3)_n$ layers of a terrace-like structure are formed on the perovskite surface (Ruddlesden-Popper phase) and with a defined n. n=1 was the thermodynamically most stable phase under oxidizing conditions when compared with perovskites of the type mentioned initially as well as when compared with Ruddlesden-Popper phases with a higher n.

At low pressures of for example 1 mbar, Ruddlesden-Popper phases with higher n of for example n=4, 5 or 6 were obtained.

Starting at 500° C., the growth of Ruddlesden-Popper phases occurred island-like. In order to obtain layers, it was necessary to use higher temperatures. In order to obtain a homogeneous coating, it is necessary with $SrTiO_3$ for example, to use a minimum temperature of about 750° C. At pressures of 100 to 200 mbar and temperatures of 800 to 950° C. Ruddlesden-Popper phases with n=1 were obtained after one to two hours. In this way layers of 200 to 300 Å thickness were obtained.

On an $AO*(ABO_3)_n$ surface of a perovskite of the type $ABO_3$ a terrace-like structure with steps is formed, whose height is 12 Å.

Also, $YBa_2Cu_3O_7$ layers were produced on the $Sr_2TiO_4$ surface (c*≈11.8 Å) of a $SrTiO_3$ substrate and on the $Pb_2TiO_4$ surface (c*≈11.91 Å) of a $Pb_2TiO_3$ substrate. The layer thicknesses of $Sr_2TiO_4$ and of $Pb_2TiO_4$ were about 200 to 300 Å.

What is claimed is:

1. A substrate comprising a perovskite of the type $ABO_3$ having a surface layer of $AO*(ABO_3)_n$ formed in a growth pattern parallel to the (100) surface of the $ABO_3$ perovskite substrate.

2. A substrate according to claim 1, wherein said $AO*(ABO_3)_n$ surface layer disposed on the substrate is a single crystal layer.

3. A method of manufacturing a substrate including a perovskite of the type $ABO_3$ with a surface layer of $AO*$ $(ABO_3)_n$, comprising the steps of: providing a substrate structure including a perovskite of the type $ABO_3$ and exposing said perovskite substrate structure to an oxidizing atmosphere at temperatures greater than 750° C. so as to form on the surface of said substrate structure an AO* $(ABO_3)_n$ layer in a growth pattern parallel to the (100) surface of the $ABO_3$ perovskite substrate structure.

* * * * *